United States Patent [19]
Tedrow

[11] Patent Number: 5,973,957
[45] Date of Patent: Oct. 26, 1999

[54] SENSE AMPLIFIER COMPRISING A PREAMPLIFIER AND A DIFFERENTIAL INPUT LATCH FOR FLASH MEMORIES

[75] Inventor: Kerry D. Tedrow, Folsom, Calif.

[73] Assignee: Intel Corporation, Santa Clara, Calif.

[21] Appl. No.: 08/931,247

[22] Filed: Sep. 16, 1997

[51] Int. Cl.[6] .................................................. G11C 16/04
[52] U.S. Cl. ...................... 365/185.03; 365/205; 365/207
[58] Field of Search ............................... 365/185.03, 205, 365/207

[56] References Cited

U.S. PATENT DOCUMENTS

| | | | |
|---|---|---|---|
| 3,753,235 | 8/1973 | Daughton et al. | 340/172.5 |
| 4,085,457 | 4/1978 | Itoh | 365/205 |
| 4,933,907 | 6/1990 | Kumanoya et al. | 365/222 |
| 5,325,335 | 6/1994 | Ang et al. | 365/205 |
| 5,550,772 | 8/1996 | Gill | 365/185.03 |
| 5,587,952 | 12/1996 | Kitsukawa et al. | 365/207 |
| 5,640,356 | 6/1997 | Gibbs | 365/207 |
| 5,642,312 | 6/1997 | Harari | 365/185.33 |
| 5,668,766 | 9/1997 | Bramnik | 365/207 |
| 5,721,701 | 2/1998 | Ikebe et al. | 365/185.03 |
| 5,734,616 | 3/1998 | Kazama et al. | 365/206 |

OTHER PUBLICATIONS

Koji Sakui, et al. "NAND Flash Memory Technology and Future Direction" ULSI Device Engineering Lab., Toshiba Corp.; Proceedings from IEEE/NVSM Wrkshp; Feb. 1997; pp. 1–34.

*Primary Examiner*—David Nelms
*Assistant Examiner*—Tuan T. Nguyen
*Attorney, Agent, or Firm*—Blakely, Sokoloff, Taylor & Zafman LLP

[57] ABSTRACT

A sense amplifier for a nonvolatile writeable memory is described. The sense amplifier has a preamplifier coupled to receive a signal from a cell of the nonvolatile writeable memory. The preamplifier uses a grounded-gate p-channel metal-oxide semiconductor input stage. A differential input latch is coupled to the preamplifier output. The differential input latch uses a pair of cross-coupled inverters. A logic device is coupled to the differential input latch output and provides the sense amplifier output signal. The logic device reduces the offset in the differential input latch and provides an output indicative of one of a number of states or voltage levels of the cell.

36 Claims, 9 Drawing Sheets

(PRIOR ART)

SENSE AMPLIFIER COMPRISING A PREAMPLIFIER AND A DIFFERENTIAL INPUT LATCH FOR FLASH MEMORIES

FIELD OF THE INVENTION

The present invention relates generally to determining the state of a semiconductor memory cell and, more particularly, to sensing the state of a flash memory cell.

BACKGROUND OF THE INVENTION

Many computing systems such as personal computers, automotive and airplane control, cellular phones, digital cameras, and handheld communication devices use nonvolatile writeable memories to store either data, or code, or both. Such nonvolatile writeable memories include Electrically Erasable Programmable Read-Only Memories (EEPROMs) and flash Erasable and Electrically Programmable Read-Only Memories (flash EPROMs, or flash memories). Nonvolatility is advantageous for allowing the computing system to retain its data and code when power is removed from the computing system. Thus, if the system is turned off or if there is a power failure, there is no loss of code or data.

Nonvolatile semiconductor memory devices are fundamental building blocks in prior art computer system designs. The primary mechanism by which data is stored in nonvolatile memory is the memory cell. Typical prior memory technologies provide a maximum storage capacity of one bit, or two states, per cell. Semiconductor memory cells having more than two possible states are known in the prior art, however.

One type of prior nonvolatile semiconductor memory is the flash electrically-erasable programmable read-only memory (flash EEPROM). Prior art flash EEPROMs typically allow for the simultaneous reading of several flash cells. Further, typical prior flash EEPROMs have a storage capacity that is much greater than the amount of data that can be output at any one time. Accordingly, each output of a flash EEPROM is typically associated with an array of flash cells that is arranged into rows and columns, where each flash cell in an array is uniquely addressable. When a user provides an address, row and column decoding logic in the flash EEPROM selects the corresponding flash cell.

Figure 1:
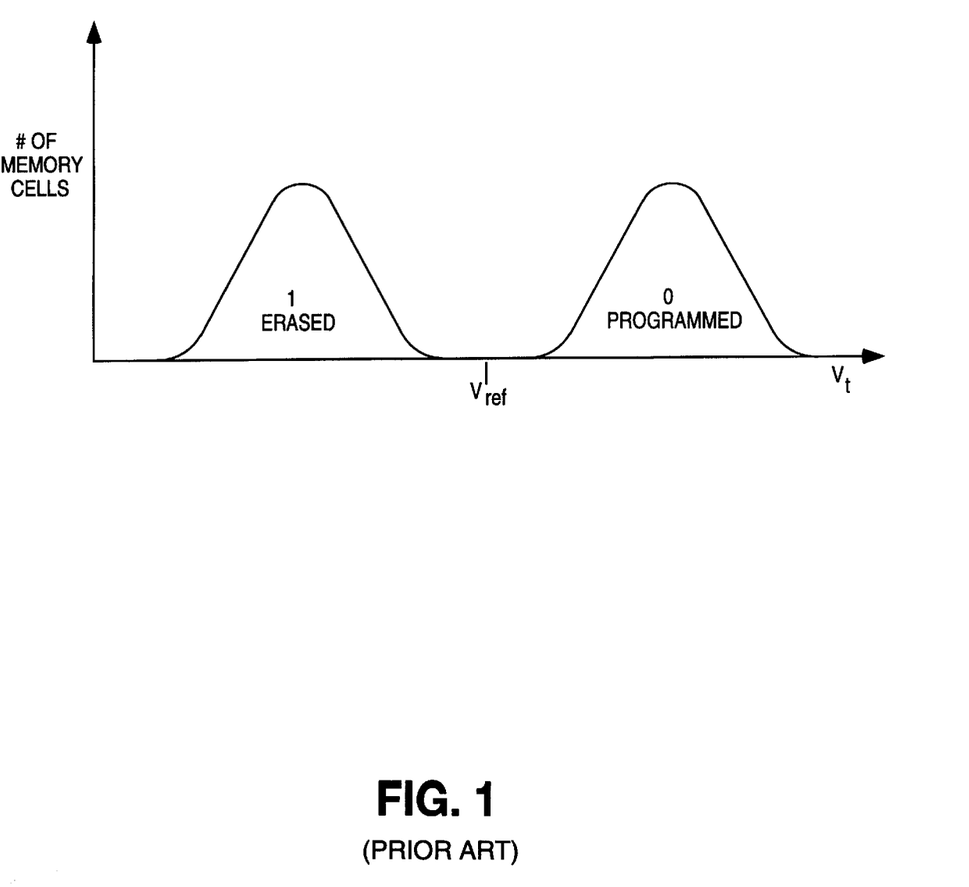
FIG. 1 shows flash cell voltage distribution as a function of $V_t$ for a prior art flash device.

A typical prior flash memory cell is comprised of a single field effect transistor (FET) including a select gate, a floating gate, a source, and a drain. Information is stored in the flash cell by altering the amount of charge on the floating gate, which causes the threshold voltage ($V_t$) of the flash cell to be varied. The typical prior art flash memory cell is in one of two possible states, being either "programmed" or "erased." FIG. 1 shows flash cell voltage distribution as a function of $V_t$ for a prior art flash device. As can be seen, the erased state and the programmed state each specify a distribution or range of $V_t$ voltages. The flash cell can theoretically possess a separate identifiable state for each electron that is added to the floating gate. Practically speaking, however, prior flash cells typically have only two possible states because of inconsistencies in flash cell structure, charge loss over time, thermal considerations and inaccuracies in sensing the charge on the floating gate that affect the ability to determine the data stored in the flash cell.

To distinguish between the two possible states, the states are separated by a separation range. According to one prior method, when a flash cell is read, the current conducted by the flash cell is compared to a current conducted by reference flash cell having a threshold voltage $V_t$ set to a predetermined reference voltage that is a voltage in the separation range. A single comparator, or sense amplifier, typically makes the comparison and outputs the result.

When a flash cell is selected for reading, a biasing voltage is applied to the select gate. Simultaneously, the same biasing voltage is applied to the select gate of the reference cell. If the flash cell is programmed, excess electrons are trapped on the floating gate, and the threshold voltage $V_t$ of flash cell has increased such that the selected flash cell conducts less drain current than the reference flash cell. The programmed state of the prior flash cell is typically indicated by a logic 0. If the prior flash cell is erased, little or no excess electrons are on the floating gate, and the flash cell conducts more drain-source current than the reference cell. The erased state of the prior flash cell is typically indicated by a logic 1.

Figure 2:
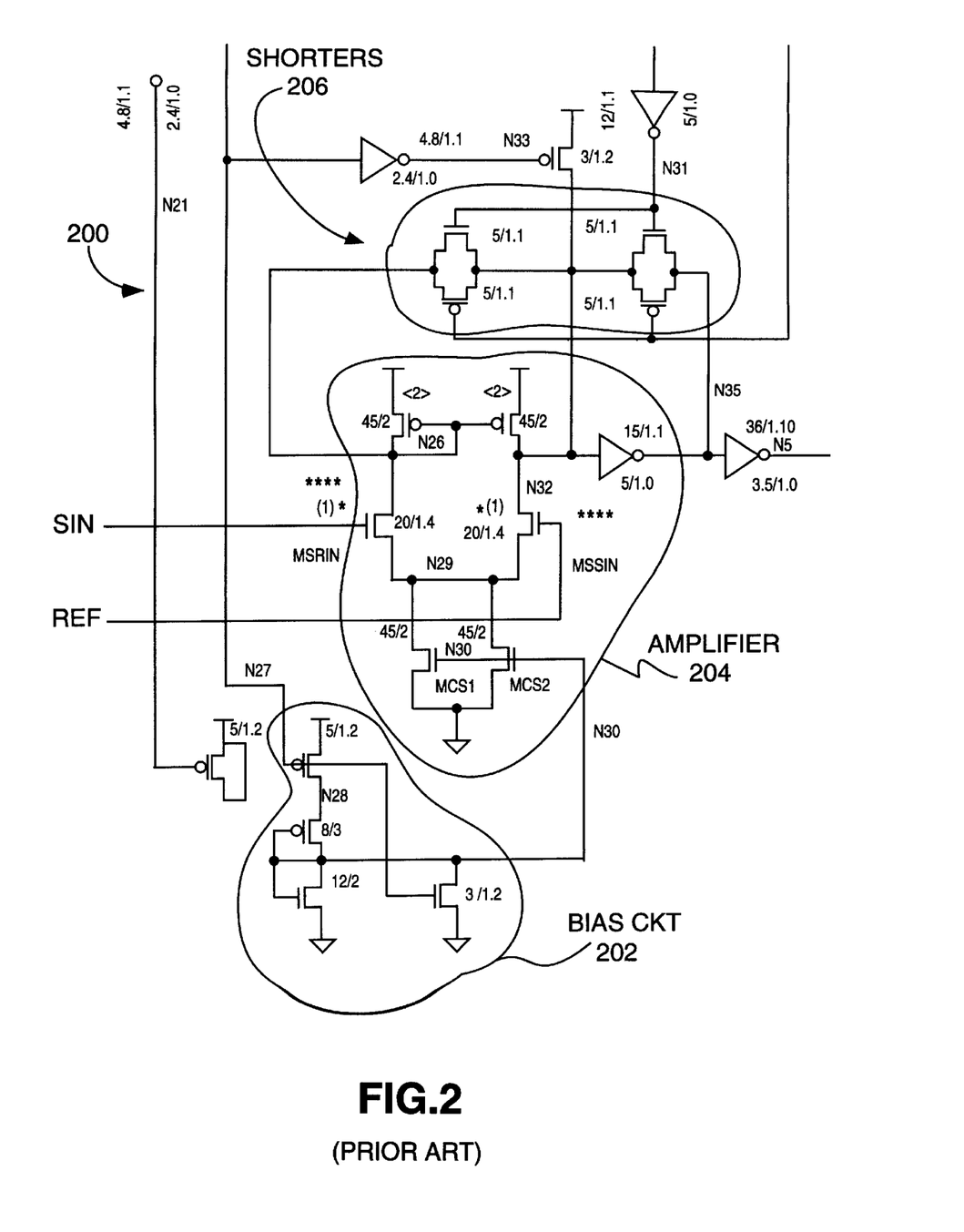
FIG. 2 shows a prior art sense amplifier.

When a flash cell has three or more possible states, the prior art sensing schemes and circuits similar to that described above typically have disadvantages. FIG. 2 shows one prior art sense amplifier 200. The prior art sense amplifier 200 is comprised of a bias circuit 202, a differential amplifier 204, and shorters 206. The differential amplifier 204 is a metal-oxide semiconductor (MOS) differential pair using a current mirror load. One disadvantage of this design is that it limits the input-high level to a value of approximately 4 volts with a Vcc of 5 volts thereby limiting the common mode rejection of the sense amplifier. While an input-high voltage of 4 volts may be adequate for a single bit per cell nonvolatile writeable memory, it is typically inadequate for multi-level-cell applications because of the limited common mode range. This differential pair typically also has poor noise rejection because of the unbalanced design in that Vcc does not couple identically to both input transistors.

Another disadvantage in the prior art sense amplifier 200 is the high bias current requirement of the differential pair of the amplifier 204, the bias current requirement typically being approximately 2.5 milliamps per sense amplifier. With a large number of sense amplifiers 200 required for a multi-level-cell application, the cumulative bias current can present power problems.

Yet another disadvantage of the prior art sense amplifier 200 is the use of shorters 206 to initialize the sense amplifier 200 in a state from which it can switch quickly between the output signal levels used by the circuit. When the shorters 206 are enabled they bias the input and output of the second stage of the differential amplifier 204 by shorting them together so that the input is biased at the trip point of the stage. This shorting is required to limit problems due to slew rate limitations of the amplifier. A disadvantage of the shorting is that the shorters 206, upon release or shorting, typically create noise spikes that feed back into the sensing circuitry. This noise can propagate through the sensing circuitry before the data gets latched and can sometimes introduce error into the latched data.

SUMMARY OF THE INVENTION

A sense amplifier for a nonvolatile writeable memory is described. The sense amplifier has a preamplifier coupled to receive a signal from a cell of the nonvolatile writeable memory. A differential input latch is coupled to the preamplifier. The differential input latch provides an output indicative of one of a number of states of the cell.

Other features and advantages of the present invention will be apparent from the accompanying drawings and from the detailed description and appended claims that follow below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A sense amplifier comprising a low gain preamplifier, a differential input latch, and a logic device to reduce the offset in the differential input latch is described for providing accurate and efficient sensing of voltage levels in nonvolatile writeable memories. This sense amplifier provides accurate sensing in multi-level-cell (MLC) nonvolatile writeable memory, or MLC flash memory. Intended advantages of the sense amplifier can include a wider common mode range or input operating range, the consumption of less power, a reduced systematic offset, a corresponding decreased latch time, and reduced noise sensitivity.

Figure 3:
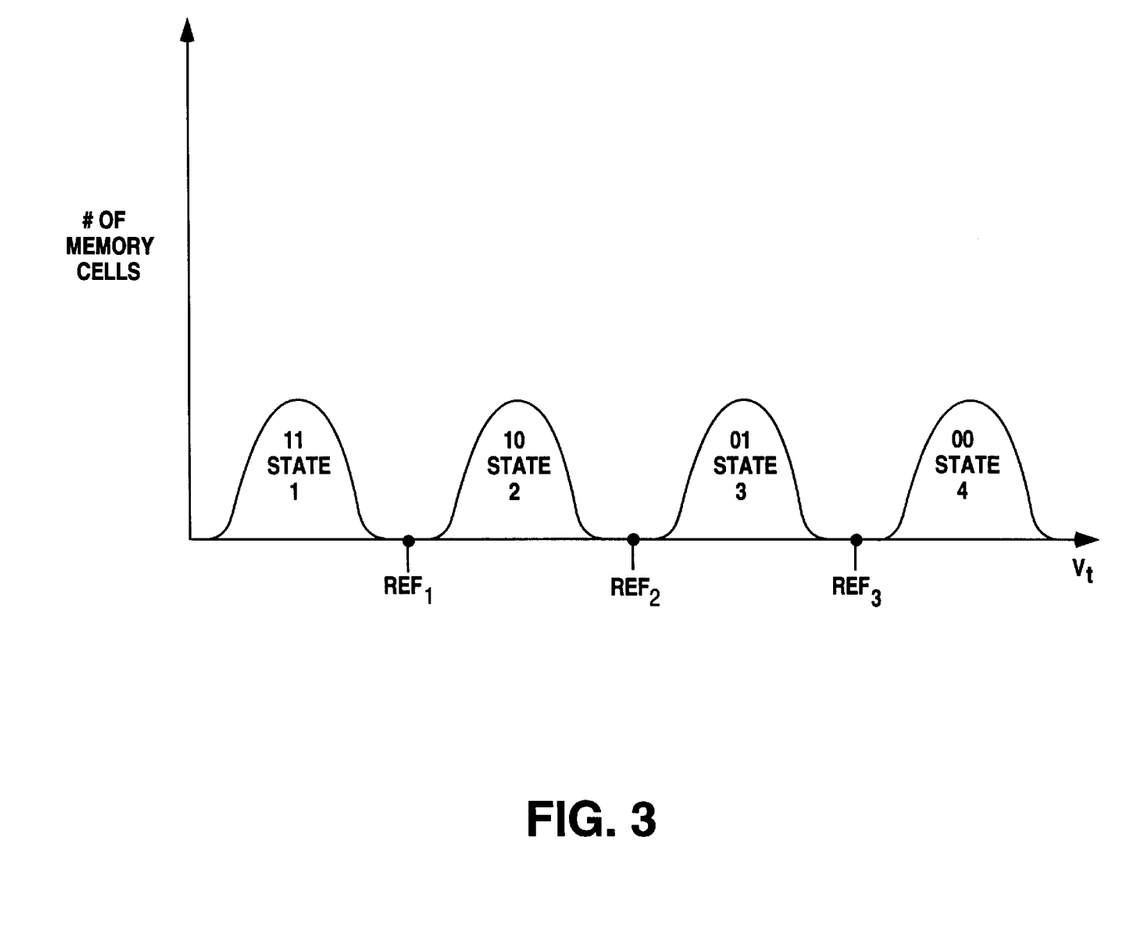
FIG. 3 shows a distribution of multi-level flash cells as a function of threshold voltage (Vt) for one embodiment.

In one embodiment of a MLC flash memory each flash cell in an array of flash cells is capable of but not limited to being in one of four analog states, and the state of the flash cell is indicated by two binary bits. FIG. 3 shows a distribution of multi-level flash cells as a function of threshold voltage (Vt) in one embodiment. As can be seen, each state is separated by a separation range, and three references, REF1, REF2, and REF3, are provided, one each for the three separation ranges. The references are provided to distinguish between the analog states. State 1 encompasses the lowest range of $V_t$ voltages of the four states and is indicated by both bits being logic 1's (both erased). State 2 is indicated when the high order bit (Bit 1) is a logic 1 and the lower order bit (Bit 0) is a logic 0. State 3 is indicated by Bit 1 being a logic 0 and Bit 0 being a logic 1. State 4 is indicated by both bits being logic 0's (both programmed). The number n of possible states is not limited to four. For example, the number of states can be three, five, sixteen, etc. Further, the mapping of binary bits to analog states may be varied. For example, the lowest range of $V_t$ voltages can be indicated by both bits being logic 0's.

Nonvolatile memory devices other than flash EEPROMs and volatile memory devices such as Dynamic Random Access Memories (DRAM) are capable of storing three or more analog states. Further, the analog states of nonvolatile devices having a floating gate may be expressed in terms other than the threshold voltage $V_t$. For example, analog states may be expressed as ranges of threshold voltages $V_t$ as previously shown as ranges of drain currents $I_D$, or as ranges of charge stored on the floating gate. Volatile memory cells such as DRAM memory cells are typically comprised of a capacitor and may similarly be expressed as ranges of charge, currents, or voltages.

A nonvolatile memory cell that has a floating gate behaves as a field effect transistor having a threshold voltage $V_t$ that increases as charge is added to the floating gate. The memory cell drain current $I_D$ (cell current) decreases as the threshold voltage Vt and cell charge level increase. The memory cell threshold voltage $V_t$ is related to the memory cell drain current $I_D$ by the expression:

$$I_D \alpha G_m \times (V_G - V_t) \text{ for } V_D > V_G - V_t$$

where $G_m$ is the transconductance of the memory cell, $V_G$ is the memory cell gate voltage, $V_D$ is the memory cell drain voltage, and $V_t$ is the memory cell threshold voltage.

Given this relationship, there are a number of different ways to sense the amount of charge stored on the floating gate of the memory cell including sensing the cell current of a memory cell when a constant voltage is applied to the select gate of the memory cell; sensing the amount of voltage required at the select gate to give rise to an expected cell current for the memory cell; sensing a voltage drop across a load that is coupled to the drain of the memory cell when a constant cell gate voltage is applied to the select gate of the memory cell, wherein the cell current determines the amount of the voltage drop across the load; and sensing the amount of voltage required at the select gate to give rise to an expected voltage drop across a load that is coupled to the drain of the memory cell. To determine the analog state of the memory cell, however, it is not necessary to quantify the precise amount of charge stored on the floating gate. It is sufficient to compare a characteristic of the memory cell to a known reference.

One type of reference is a reference memory cell programmed to have a known threshold voltage $V_t$ that is typically between defined states. Sensing circuitry for the memory cell may be replicated for the reference memory cell and the outputs of the sensing circuitry and reference sensing circuitry may be compared using a differential comparator. Because sensing the cell charge level of a memory cell typically requires the comparison of either voltages or currents, the reference may be provided by using voltage supplies or current sources to supply voltages or currents that correspond to reference memory cells having a cell charge level between defined analog states. For this reason, the references REF1, REF2, and REF3 are not specified as being threshold voltages, cell currents, or levels of charge stored on a floating gate. Instead, it is to be understood that these references correspond to the characteristics of the memory cell as defined by the relationship between cell charge level, cell current $I_D$, and threshold voltage $V_t$.

When sensing the amount of charge stored on a floating gate of a memory cell by sensing a voltage drop across a load that is coupled to the drain of the memory cell when a constant voltage is applied to the select gate of the memory cell, the load maps the threshold voltage Vt to the sense amplifier input voltage, or the column voltage. As such, a high Vt indicates a lower cell current which indicates a higher sense amplifier input voltage. Therefore, the plot of FIG. 3 can be made to represent the column voltage, or sense amplifier input voltage, by changing the label of the x-axis to "column voltage".

Figure 4:
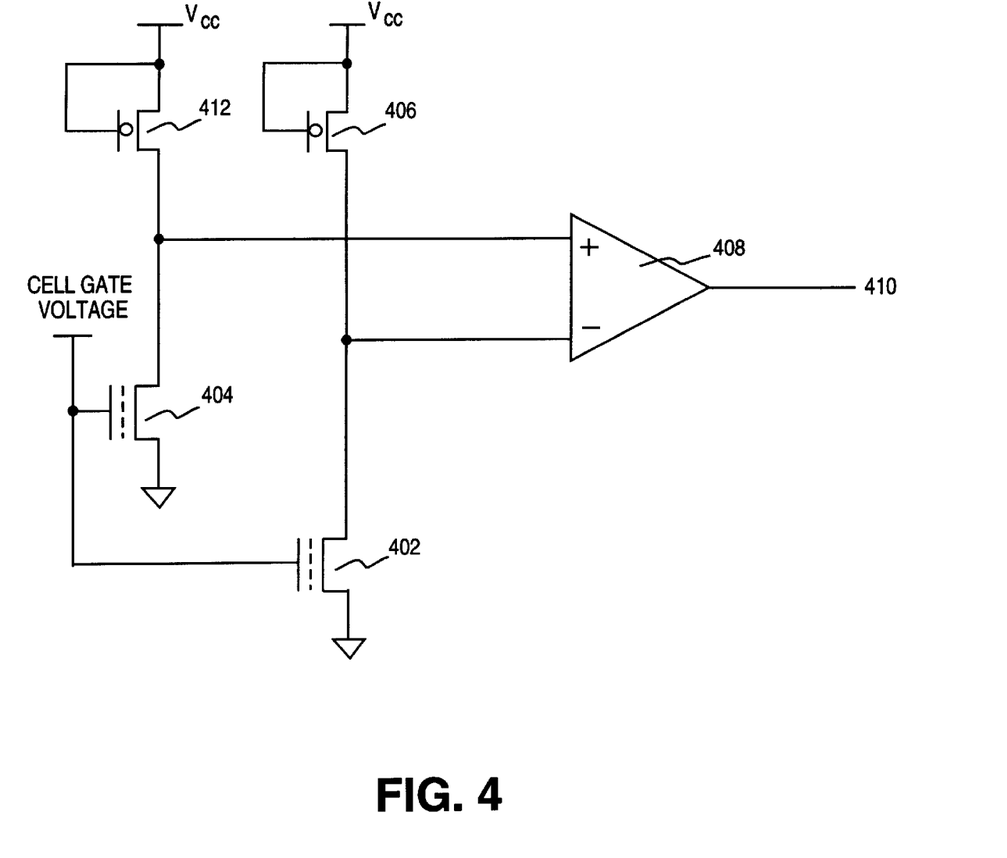
FIG. 4 shows a single bit flash cell and a corresponding sense amplifier for one embodiment.

The remainder of the discussion herein will primarily be directed to sensing the amount of charge stored on a floating gate of a memory cell by sensing a voltage drop across a load that is coupled to the drain of the memory cell. FIG. 4 shows a single bit flash cell and a corresponding sense amplifier for one embodiment. The function of the sense amplifier 408, or comparator, is to make a comparison of the cell being sensed 402 to a reference cell 404. This comparison is accomplished by passing the cell current through a load device 406 which converts the current to a voltage. The load device 406 is an S-device in one embodiment, but is not so limited; for example, the load device 406 may be a p-channel device having a grounded gate or a resistor. The S-device is a high transconductance n-channel transistor that is specially doped to provide a threshold voltage that is lower than the threshold voltage of a standard n-channel CMOS device. For one embodiment, the S-device is doped to have a threshold voltage of approximately 0.3 volts. The sense amplifier 408, or comparator, then compares the threshold voltage Vt 404 from a reference cell to the voltage of the flash cell 402 and provides an output 410 based on the results of the comparison. The load device 412 of the reference cell, for one embodiment, is the same type of device as the load device 406 or the flash cell.

Figure 5:
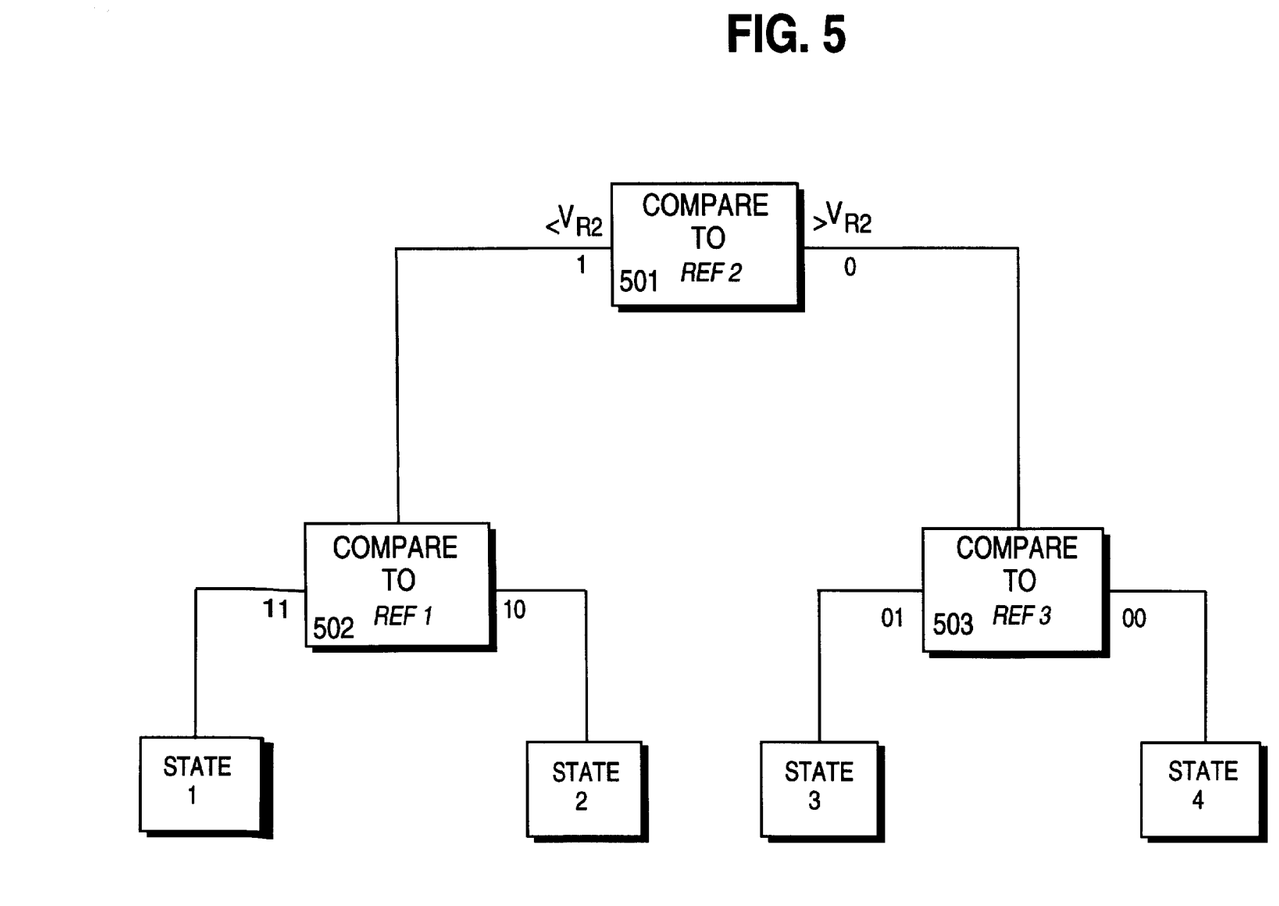
FIG. 5 is a block diagram showing a binary search method for determining the state of a memory cell having more than two possible states.

As previously discussed, each flash cell in an MLC flash array is capable of being in one of four analog states, and the state of this flash cell is indicated by two binary bits. FIG. 5 is a block diagram showing a binary search method for determining the state of a memory cell having more than two possible states. In step 501, the cell charge level of the selected cell is sensed and compared to a first reference flash cell having its $V_t$ equal to REF2. Depending on the result of the initial comparison, the sensed cell charge level of the selected cell is compared to a selected one of a second reference flash cell having its $V_t$ equal to REF1 or a third reference flash cell having its $V_t$ equal to REF3. If the sensed cell charge level of the selected flash is less than that of the first reference flash cell, the sensed cell charge level is compared to the second reference flash cell at step 2, and the selected flash cell is either in state 1 or state 2. If the sensed cell charge level of the selected flash is greater than that of the first reference flash cell, the sensed cell charge level is compared to the third reference flash cell at step 503, and the selected flash cell is either in state 3 or state 4. Sensing of the cell charge level may be done according to any of the methods previously discussed.

Figure 6:
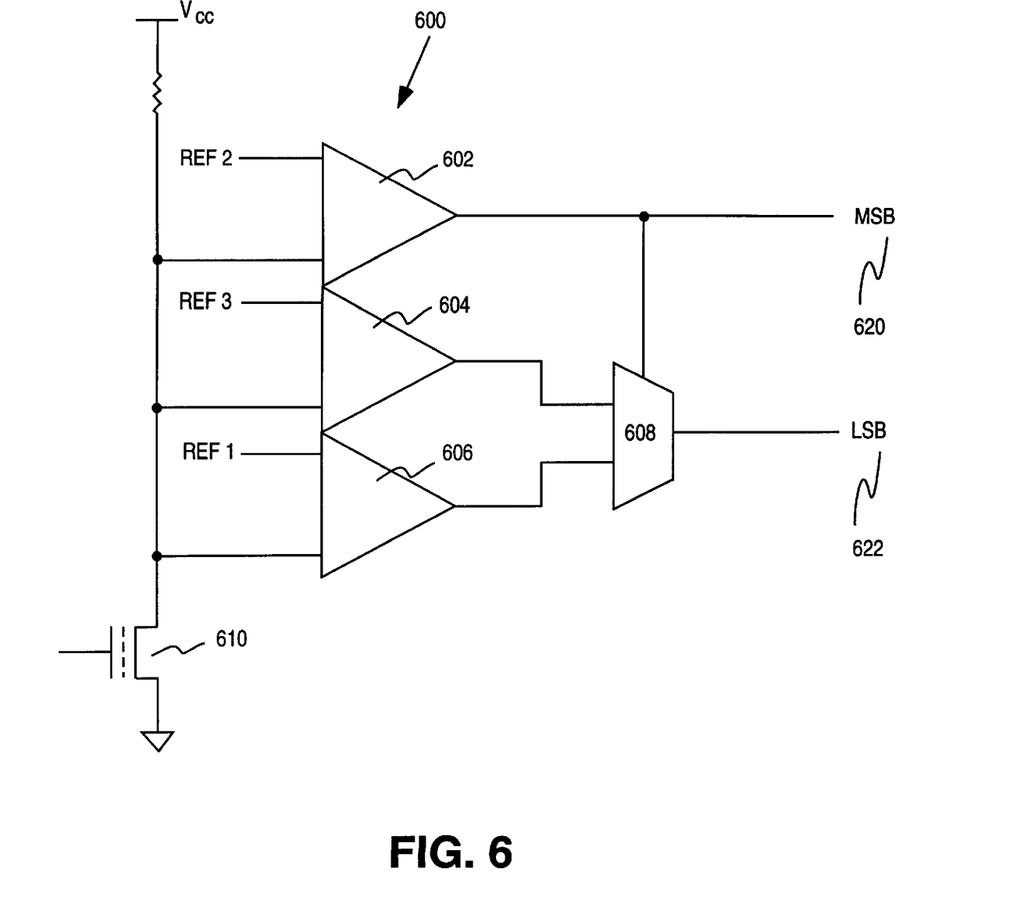
FIG. 6 shows a MLC flash memory cell with a corresponding sense block for one embodiment.

Sensing of the cell charge level in an MLC flash array using the binary search method is performed in one embodiment using a sense block. FIG. 6 shows a MLC flash memory cell 610 with a corresponding sense block 600 in one embodiment. The sense block 600 is comprised of three sense amplifiers 602, 604, and 606 that are each coupled to the flash cell 610 and to reference cells 2, 3, and 1 (not shown), respectively. The sense block 600 outputs two bits of data 620 and 622 indicative of one of the four voltage levels stored by the flash cell.

With reference to FIG. 3, the two-bit output of the sense block 600 corresponds to one of four voltage levels stored by the flash cell 610. Both the most significant bit (MSB) 620 and the least significant bit (LSB) 622 can be either a "0" or a "1". Sense amplifier 602 is coupled to REF2, and the output of sense amplifier 602 determines the MSB of the sense amplifier output. When the flash cell 610 voltage is above the voltage of REF2, then the MSB of the output will be a "0", and the multiplexer 608 selects the output of sense amplifier 604 to determine the LSB because the flash cell 610 voltage is either at state 3 or state 4. When the flash cell 610 voltage is above the REF3 voltage a "0" is output as the LSB which corresponds to a state 4 voltage ("00"); when the flash cell 610 voltage is below the REF3 voltage a "1" is output as the LSB which corresponds to a state 3 voltage ("01").

When the flash cell 610 voltage is below the voltage of REF2, then the MSB of the output will be a "1", and the multiplexer 608 selects the output of sense amplifier 606 to determine the LSB because the flash cell 610 voltage is either at state 1 or state 2. When the flash cell 610 voltage is above the REF1 voltage a "0" is output as the LSB which corresponds to a state 2 voltage ("10"); when the flash cell 610 voltage is below the REF1 voltage a "1" is output as the LSB which corresponds to a state 1 voltage ("11").

Figure 7:
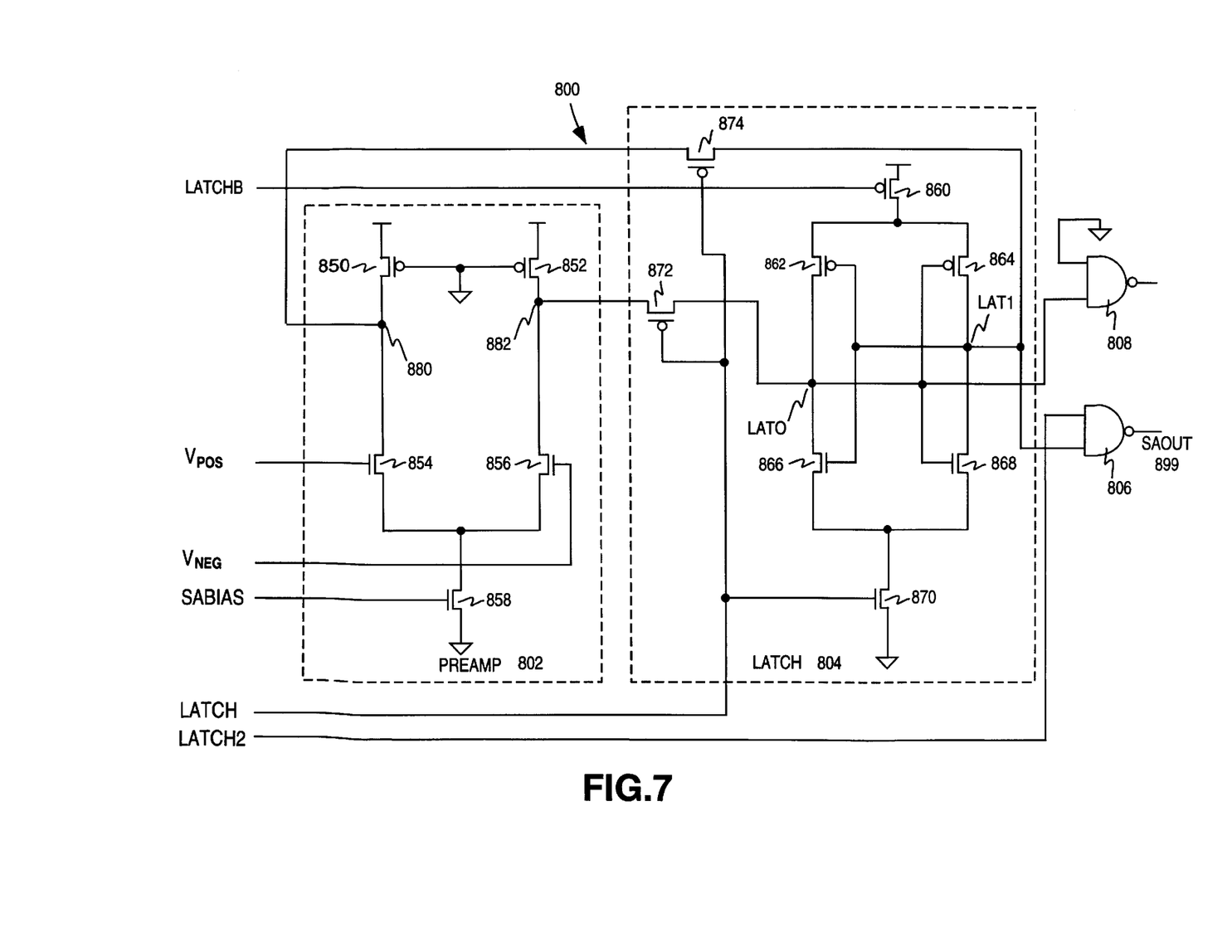
FIG. 7 shows the sense amplifier of one embodiment.

FIG. 7 shows the sense amplifier 800 of one embodiment. The sense amplifier 800 comprises a preamplifier 802 coupled to receive signals Vpos and Vneg from a flash cell (not shown) and a reference cell (not shown), a differential input latch 804 coupled to the preamplifier 802, and NAND gate logic devices 806 and 808 coupled to the differential input latch 804. The sense amplifier 800 provides an output 899 from NAND gate logic device 806. The sense amplifier 800 is comprised of p-channel transistors 850, 852, 860, 862, 864, 872, and 874 and n-channel transistors 854, 856, 858, 866, 868, and 870.

The preamplifier 802 in one embodiment serves as a buffer between the flash cell and reference cell inputs and the differential input latch 804. Instead of using a conventional current mirror load, the preamplifier 802 uses the grounded gate p-channel metal-oxide semiconductor (MOS) current load of transistors 850 and 852. This grounded gate configuration increases the common mode range of the sense amplifier 800, or the range of input voltage values over which the sense amplifier 800 is functional.

The conventional current mirror of the prior art reduces the drain voltage (Vd) of one of the preamplifier inputs. Using circuit analysis techniques known in the art, the reduced drain voltage can be shown to result in a voltage drop from the drain to source (Vds) of the input transistor of approximately 1.75 volts. Because the common mode input-high level is limited to a value substantially equal to Vcc minus Vds plus the $V_t$ of the input pair, the Vds of 1.75 volts results in the limitation of the common mode input-high level voltage to a value of approximately 4 volts in a circuit using a 5 volt Vcc.

The grounded gate p-channel device comprising transistors 850 and 852 of preamplifier 802 raises the input operating voltage by eliminating the threshold voltage Vt drop between Vcc and node 880, thereby raising the voltage at node 880. A higher voltage at node 880 allows a higher input voltage on the Vneg input to the preamplifier while still keeping transistor 854 saturated. Transistor 854 should remain in saturation because transistor 854 dropping out of saturation limits the input-high voltage. The grounded gate p-channel device of preamplifier 802 therefore has a much smaller Vds of approximately 0.5 volts resulting in a common mode input-high level of approximately 5.25 volts in a circuit using a 5 volt Vcc. Thus, the common mode range provided by the preamplifier 802 is adequate for MLC flash applications. Furthermore, another advantage to the grounded-gate load is that is has better Vcc noise rejection because of the balanced design in which Vcc is coupled substantially identically through transistor 850 and 852 to nodes 880 and 882.

The grounded gate p-channel device of preamplifier 802 also results in a significantly reduced bias current requirement for the sense amplifier 800 of one embodiment. Using circuit analysis techniques known in the art, the bias current or tail current into transistor 858 is determined to have a nominal value of approximately 100 microamps and a maximum value of 150 microamps. Thus, the bias current requirement for sense amplifier 800 is significantly less than the 2.5 milliamps bias current required of prior art sense amplifiers.

The preamplifier 802 of sense amplifier 800 amplifies the inputs from the flash cell and the reference cell. Circuit analysis techniques known in the art show the amount of gain provided by the preamplifier 802 in the differential mode to be approximately three. This low gain is an intended advantage of the sense amplifier 800 because it significantly decreases the response time of the sense amplifier without the use of the shorters of the prior art sense amplifier.

Figure 8:
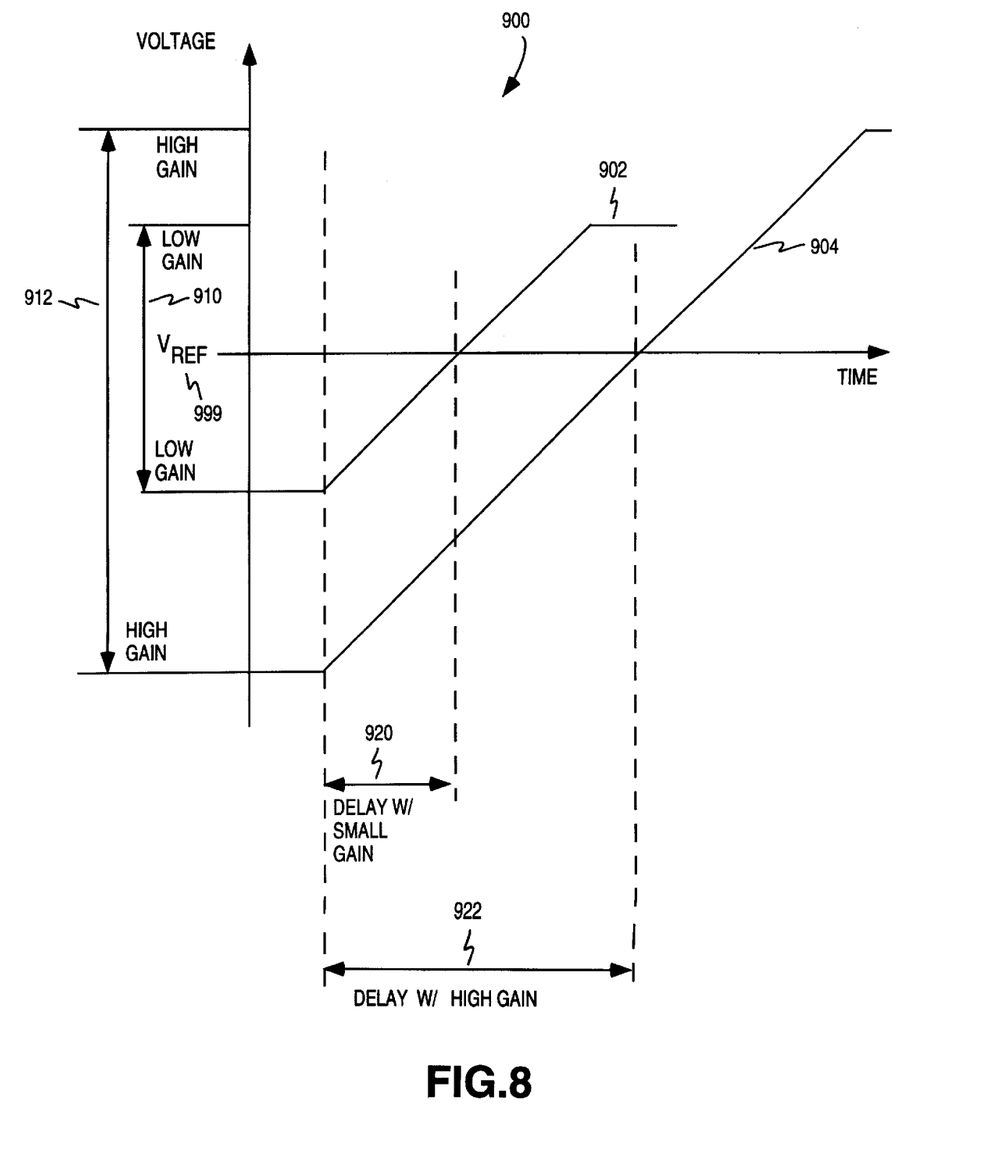
FIG. 8 shows the slew rate response of a low gain circuit relative to the slew rate response of a high gain circuit.

FIG. 8 shows the slew rate response 902 of a low gain circuit relative to the slew rate response 904 of a high gain circuit. The sense amplifier senses a change in state when a voltage differential is detected, and the sense amplifier responds to this state change by transitioning the sense amplifier output from one state to another state, a transition requiring a change from one voltage level to another. The time differential between sensing a state change and transitioning the output voltage level depends on the gain and slew rate of the sense amplifier. The slew rate is determined by the components of each circuit, and is assumed to be the same in both low and high gain circuits so that the slope of curves 902 and 904 are equivalent. However, the lower gain of the low gain circuit results in a smaller range 910 of voltages over which the sense amplifier must transition relative to the range 912 of voltage of the high gain circuit. Therefore, assuming an equivalent slew rate of both circuits, the low gain circuit will provide a transition at the output in less time 920 than the time 922 required of the high gain circuit.

As previously discussed, shorters are required in prior art sense amplifiers because of the high gain of these sense amplifiers. The shorters bias the sense amplifier at a point in the common mode range that minimizes the output voltage transition time. However, the shorters themselves increase the response time of the sense amplifier as well as introducing noise into sensing circuitry. Therefore, a low gain sense amplifier without shorters responds quicker to input voltage changes than a high gain sense amplifier with shorters without introducing the additional noise of the shorters into the sensing circuitry.

The low gain of the preamplifier 802 of the sense amplifier 800 is also advantageous in that it reduces the sense amplifier offset (SAO). The SAO is an offset or shift in the voltage range of a flash cell level resulting from the shift in Vt that accompanies erase and program operations in flash cells. Consequently, the SAO results in some variation of the voltage delta between the reference cell voltages and the ranges of Vt voltage for each state of a flash cell. As a result of the uncertainty in the location of the flash cell Vt because of the SAO, a certain amount of additional voltage must be set aside in the window budget or the common mode input range of prior art sense amplifiers to allow for the SAO between each reference voltage and each Vt. If the voltage set aside to accommodate the SAO is too small then there can be encroachment by the Vt of one cell into the Vt of another cell resulting in the overlapping of Vt voltage ranges and a corresponding loss of MLC states. A MLC flash cell is more sensitive to SAO because of the multiple states that are accommodated in the common mode voltage range or window budget of the flash cell. The larger the SAO then the larger the voltage that must be set aside to accommodate SAO and the fewer number of states available in a MLC flash cell.

The SAO is reduced as a result of the gain of the preamplifier 802 of one embodiment of the sense amplifier 800. The SAO is reduced because it is divided by the gain of the sense amplifier. Thus, the preamplifier 802 of one embodiment of the sense amplifier 800 reduces the SAO by a factor of approximately three.

The use of the low gain grounded gate p-channel load is enabled by the use of a differential input latch 804. The differential input latch 804 in one embodiment comprises a pair of cross-coupled inverters whose outputs are each tied to the inputs of the other inverter. Each inverter has it's power supply switched through transistors 860 and 870. While not drawing static current, this differential input latch 804 reduces sense amplifier offset by having a differential input versus the single-ended input of the prior art sense amplifiers.

The differential input latch 804 is an analog-to-digital conversion stage which converts the preamplifier 802 output signal, which is non-complementary metal-oxide semiconductor (CMOS), to a CMOS-level signal. The differential input latch 804 uses three operating states: sample state; float state; and latch state. In general, the differential input latch 804 operates by sampling two inputs and storing the samples. The latch is then enabled and the output is set to "0" or "1" depending upon the differential sensed between the two inputs. Each of the three operating states of the differential input latch will now be described.

Figure 9:
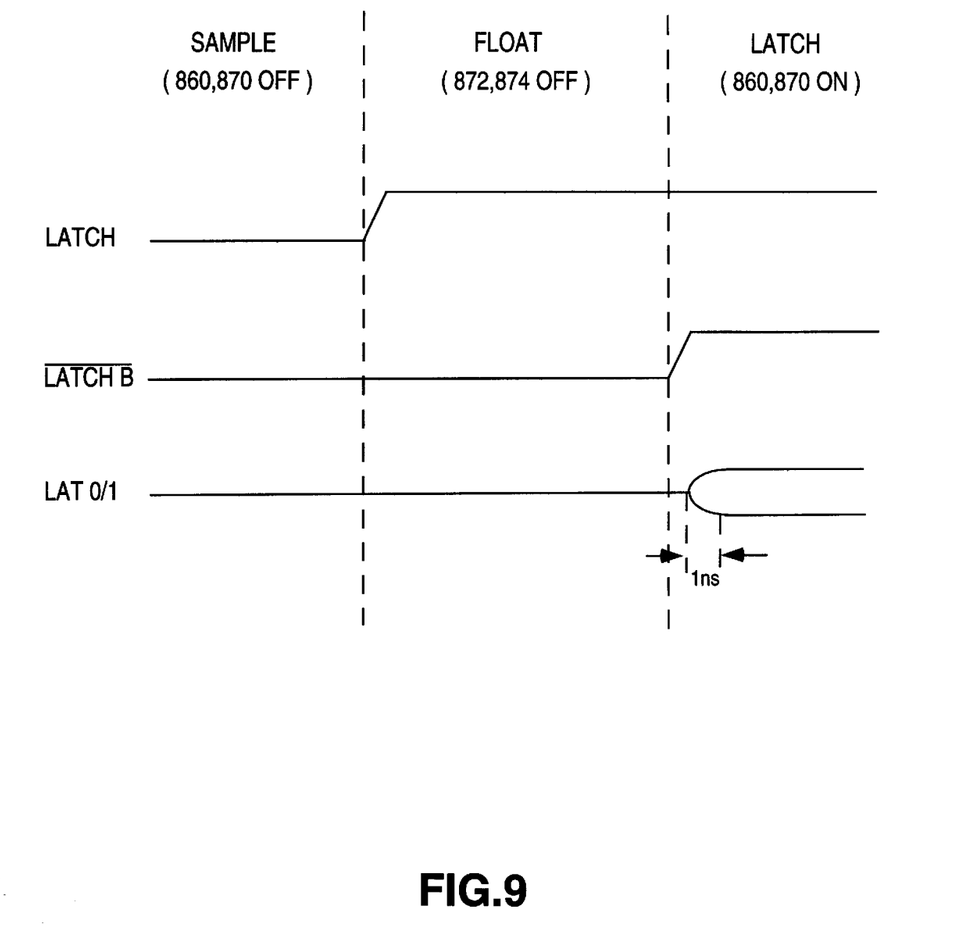
FIG. 9 shows a signal timing diagram for the three states of the differential input latch.

In the sample state, the outputs from nodes 880 and 882 of the preamplifier 802 provide the inputs to nodes LAT1 and LAT0 of the differential input latch 804, respectively, for comparison. FIG. 9 shows a signal timing diagram for the three states of the differential input latch. During the sampling state, the LATCH signal is deasserted which turns on transistors 872 and 874 and turns off transistor 870, resulting in the preamplifier signals being passed from nodes 880 and 882 to nodes LAT1 and LAT0, respectively. As transistors 860 and 870 are off during the sampling state there is no path between Vcc and ground so that the signals from nodes 880 and 882 are passed to nodes LAT1 and LAT0, respectively, without contention. Therefore, the voltages at nodes LAT1 and LAT0 will be equal to Vneg and Vpos, respectively.

The float state follows the sample state in one embodiment. In the float state, transistors 872 and 874 are turned off when the LATCH signal is asserted. During this state, which is of short duration, LAT1 and LAT0 float at their respective voltages, voltages stored during the sample state.

The latch state follows the float state in one embodiment. In the latch state, transistors 860 and 870 are turned on which switches the power supplies of each inverter to the inverter thereby causing any differential between LAT1 and LAT0 to be amplified. In order to illustrate the operation of the differential input latch 804, an example will be used in which the voltage at node LAT1 is greater than the voltage at node LAT0. In this situation, the gate voltage (Vg) of transistor 866 is greater than the gate voltage Vg of transistor 868 which causes transistor 866 to conduct more current than transistor 868. This has a positive feedback effect because the drain of transistor 866 is connected to the gate of transistor 868. As both LAT1 and LAT0 transition to a low voltage, the positive feedback effect causes the transistor having the higher gate voltage, 866, to have its drain voltage Vd go lower faster than the drain voltage Vd of the transistor having the lower gate voltage, 868. Because the drain voltage of transistor 866 goes low faster, it will slow the discharge rate of node LAT0 thereby turning off transistor 868 slower than transistor 866 is being turned off. This causes the voltage differential to grow at an increasing rate because the differential in gate voltages is increasing. This results in a fast switching time, even in the presence of a very small initial differential voltage. One embodiment switches the output between the rail voltages in approximately one nanosecond. This fast switching time reduces noise sensitivity of the sense amplifier because the comparison result is latched into the differential input latch 804 before downstream switching noise can feed back into the sensing circuits.

The output of the sense amplifier is provided by a NAND gate logic device 806 in one embodiment. The NAND gate is used instead of the inverter of the prior art sense amps because as an inverter switches it produces a dynamic capacitance. This capacitance allows an offset to be introduced into the sensing circuit through coupling of the output voltage signal change back to the input. The detrimental effects of offset were previously discussed.

In operation, the NAND gate 806 receives the output of the differential input latch 804. After the output state is determined by the latch 804, or about one nanosecond after switching in response to a differential input voltage in one embodiment, the NAND gate is enabled with the LATCH2 signal and the sense amplifier output is switched. A dummy NAND gate 808 is used to match the gate capacitances on LAT0 and LAT1 to prevent an offset in the latch.

Although the detailed description describes embodiments using a flash EPROM, the invention may be used with any nonvolatile writeable memory. While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A sense amplifier for use in a nonvolatile memory, the sense amplifier comprising:
   a preamplifier coupled to receive a first signal from a memory cell of the nonvolatile memory and a second signal from at least one reference voltage, the preamplifier being configured to output a pair of signals indicative of a difference between the first signal and the second signal; and
   a differential input latch coupled to receive the pair of signals output from the preamplifier and to generate a signal indicative of at least one state of the memory cell according to the difference indicated by the pair of signals.

2. The sense amplifier of claim 1, wherein the sense amplifier is used in a multiple state cell nonvolatile memory.

3. The sense amplifier of claim 1, further comprising at least one logic device coupled to the differential input latch, the at least one logic device reducing the offset in the sense amplifier and providing the signal indicative of the at least one state of the memory cell.

4. The sense amplifier of claim 1, wherein the at least one state comprises at least one voltage level of the memory cell.

5. The sense amplifier of claim 1, wherein the signal indicative of at least one state of the memory cell comprises at least one bit.

6. The sense amplifier of claim 1, wherein the preamplifier comprises at least one grounded-gate metal-oxide semiconductor (MOS) transistor.

7. The sense amplifier of claim 2, wherein a plurality of the sense amplifiers are coupled to a plurality of nonvolatile memory cells and a plurality of reference voltages.

8. The sense amplifier of claim 1, wherein the at least one reference voltage is provided by at least one reference cell.

9. The sense amplifier of claim 8, wherein the at least one reference voltage is selected in response to the voltage level of the memory cell.

10. The sense amplifier of claim 1, wherein the differential input latch operates in at least one state.

11. The sense amplifier of claim 1, wherein the differential input latch converts the pair of signals output from the preamplifier to an output signal having complementary MOS logic levels.

12. The sense amplifier of claim 1, wherein the first signal from a memory cell of the nonvolatile memory comprises a voltage.

13. The sense amplifier of claim 1, wherein the preamplifier provides at least one output signal amplified by a factor substantially equal to three.

14. The sense amplifier of claim 1, wherein the differential input latch comprises a pair of cross-coupled inverters, each inverter having its output coupled to the other inverter.

15. A sense amplifier for use in a multiple state cell nonvolatile memory, the sense amplifier comprising:
   a preamplifier coupled to receive a first signal from a memory cell of the nonvolatile memory and a second signal from at least one reference voltage, the preamplifier being configured to output a pair of signals indicative of a difference between the first signal and the second signal; and
   a differential input latch coupled to receive the pair of signals output from the preamplifier and to generate a signal indicative of at least one state of the memory cell of the nonvolatile memory according to the difference indicated by the pair of signals.

16. The sense amplifier of claim 15, wherein at least one logic device is coupled to the differential input latch, the at least one logic device reducing the offset of the sense amplifier and providing the signal indicative of the at least one state of the memory cell.

17. The sense amplifier of claim 15, wherein the preamplifier comprises at least one grounded-gate metal-oxide semiconductor (MOS) transistor.

18. The sense amplifier of claim 15, wherein a plurality of the sense amplifiers are coupled to the memory cell of the nonvolatile memory.

19. The sense amplifier of claim 15, wherein the preamplifier performs level shifting.

20. The sense amplifier of claim 15, wherein the sense amplifier has a common mode input range and an offset that supports a nonvolatile memory having four different threshold voltages.

21. The sense amplifier of claim 19, wherein the preamplifier provides at least one output signal amplified by a factor substantially equal to three.

22. The sense amplifier of claim 15, wherein the sense amplifier has a nominal bias current substantially equal to 100 microamps.

23. The sense amplifier of claim 15, wherein the at least one reference voltage is provided by at least one reference cell.

24. The sense amplifier of claim 23, wherein the at least one reference voltage used by the sense amplifier is determined by the voltage level of the memory cell.

25. The sense amplifier of claim 15, wherein the differential input latch comprises a pair of cross-coupled inverters, each inverter having its output coupled to an input of the other inverter, each inverter having its power supply switched through at least one transistor.

26. The sense amplifier of claim 15, wherein the differential input latch operates in at least one state.

27. The sense amplifier of claim 15, wherein the differential input latch converts the pair of signals output from the preamplifier each having a first pair of logic levels to an output signal having a second pair of logic levels.

28. The sense amplifier of claim 27, wherein the second pair of logic levels are complementary MOS logic levels.

29. The sense amplifier of claim 15, wherein the signal indicative of at least one state of the memory cell comprises at least one bit.

30. The sense amplifier of claim 15, wherein the first signal from a cell of the nonvolatile memory comprises a voltage.

31. The sense amplifier of claim 15, wherein the first signal from a cell of the nonvolatile memory comprises a current.

32. A sense block for use in a multiple state cell nonvolatile memory, the sense block comprising a plurality of sense amplifiers, each of the plurality of sense amplifiers comprising:

a preamplifier coupled to receive a first signal from a memory cell of the nonvolatile memory and a second signal from at least one reference voltage, the preamplifier being configured to output a pair of signals indicative of a difference between the first signal and the second signal;

a differential input latch coupled to receive the pair of signals output from the preamplifier and to generate a latched output signal having a state according to the difference indicated by the pair of signals; and at least one logic device coupled to receive the latched output signal from the differential input latch, the at least one logic device being configured to reduce the offset of the sense amplifier and to provide a signal indicative of at least one state of the memory cell according to the state of the latched output signal.

33. The sense block of claim 32, wherein N-1 sense amplifiers decode N states of the nonvolatile memory, wherein N is an integer equal to or greater than 2.

34. The sense block of claim 32, wherein the preamplifier comprises at least one grounded-gate MOS transistor; and wherein the differential input latch comprises at least a pair of cross-coupled inverters.

35. The sense block of claim 32, further comprising:

a first reference corresponding to a first threshold voltage level of the memory cell, the first reference coupled to a first sense amplifier for comparing the threshold voltage level to the first reference, and for outputting a first result;

a second reference corresponding to a second threshold voltage level of the memory cell, the second reference coupled to a second sense amplifier for comparing the threshold voltage level to the second reference, and for outputting a second result;

a third reference corresponding to a third threshold voltage level of the memory cell, the third reference coupled to a third sense amplifier for comparing the threshold voltage level to the third reference, and for outputting a third result;

a selector circuit coupled for receiving the first result, the selector circuit selecting one of the second result and the third result for output in response to the first result.

36. The sense block of claim 35, wherein the first result and the selected one of the second result and the third result indicate the voltage level of the memory cell.

* * * * *